US006912021B2

(12) United States Patent
Kimura

(10) Patent No.: US 6,912,021 B2
(45) Date of Patent: Jun. 28, 2005

(54) ELECTRO-OPTICAL DEVICE, METHOD FOR DRIVING ELECTRO-OPTICAL DEVICE, ELECTRONIC APPARATUS, AND METHOD FOR DRIVING ELECTRONIC APPARATUS

(75) Inventor: Mutsumi Kimura, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 131 days.

(21) Appl. No.: 10/045,060

(22) Filed: Jan. 15, 2002

(65) Prior Publication Data

US 2002/0196387 A1 Dec. 26, 2002

(30) Foreign Application Priority Data

Jan. 22, 2001 (JP) .................................. 2001-013121

(51) Int. Cl.⁷ ............................................ G02F 1/1335
(52) U.S. Cl. ........................ 349/69; 349/61; 349/113; 349/114
(58) Field of Search ............................ 349/69, 61, 114, 349/113, 19; 313/510, 519

(56) References Cited

U.S. PATENT DOCUMENTS

| 5,610,628 | A | * | 3/1997 | Yamamoto et al. | 345/100 |
| 6,025,894 | A | * | 2/2000 | Shirasaki et al. | 349/69 |
| 6,133,976 | A | * | 10/2000 | Kimura | 349/138 |
| 6,162,667 | A | * | 12/2000 | Funai et al. | 438/166 |
| 6,373,454 | B1 | * | 4/2002 | Knapp et al. | 345/76 |
| 6,475,845 | B2 | * | 11/2002 | Kimura | 438/200 |
| 6,556,260 | B1 | * | 4/2003 | Itou et al. | 349/49 |
| 2002/0084746 | A1 | * | 7/2002 | Anzai | 313/504 |
| 2002/0158823 | A1 | * | 10/2002 | Zavracky et al. | 345/87 |

FOREIGN PATENT DOCUMENTS

| JP | A-9-90345 | 4/1997 |
| JP | 09-139286 | 5/1997 |
| JP | A-9-233107 | 9/1997 |
| JP | A-10-68931 | 3/1998 |
| JP | A-11-305740 | 11/1999 |
| JP | 2000-113988 A | 4/2000 |

OTHER PUBLICATIONS

M. Kimura et al., "TFT–LEPD with Image Uniformity by Area Ratio Gray Scale", Proc. Euro Display '99, Late–News Papers, pp. 71–74.
M. Kimura et al., "Low–Temperature Poly–Si TFT Driven Light–Emitting–Polymer Displays and Digital Gray Scale for Uniformity", Proc. *IDW* '99, pp. 171–174.
M. Kimura et al., "Low–Temperature Poly–Si TFT Display using Light–Emitting–Polymer", *AM–LCD* 2000, pp. 245–248.
M. Kimura et al., "An area–ratio gray–scale method to achieve image uniformity in TFT–LEPDs", *Journal of the SID* 8/2, 2000, pp. 93–97.

(Continued)

*Primary Examiner*—Tarifur R. Chowdhury
*Assistant Examiner*—Mike Qi
(74) *Attorney, Agent, or Firm*—Oliff & Berridge, PLC

(57) ABSTRACT

The invention addresses or overcomes poor visibility of an organic electroluminescence display device in a bright place, and also addresses or overcomes an increase in power consumption caused by an attempt to increase the luminance for the purpose of enhancing visibility. In accordance with TFTs, the amount of light emission of an organic electroluminescence display element is controlled in a dark place, and the amount of light transmission of a liquid crystal display element is controlled in a bright place. A static RAM is provided in each sub-pixel by an area ratio gray-scale method. Low-temperature polycrystalline silicon TFTs are used for the TFTs, luminescent polymer is used for the organic electroluminescence display element, and super twisted nematic liquid crystal is used for a reflective liquid crystal display element.

23 Claims, 9 Drawing Sheets

OTHER PUBLICATIONS

T. Shimoda et al., "High Resolution Light Emitting Polymer Driven Display by Low Temperature Polysilicon Thin Film Transistor with Integrated Driver", *Asia Display* '98, pp. 217–220.

T. Shimoda et al., "Multicolor Pixel Patterning of Light–Emitting Polymers by Ink–Jet Printing", *SID 99 DIGEST*, pp. 376–379.

S. Kanbe et al., "Patterning of High Performance Poly(dialkylfluorene) derivatives for Light–Emitting Full Color Display by Ink–jet Printing", Proc. Euro Display '99 Late–News Papers, pp. 85–88.

"Color liquid crystal display playing a leading roll in mobile technologies", Session 4 of talks at Electronic Display Forum 98, pp. 1–50.

* cited by examiner

ELECTRO-OPTICAL DEVICE, METHOD FOR DRIVING ELECTRO-OPTICAL DEVICE, ELECTRONIC APPARATUS, AND METHOD FOR DRIVING ELECTRONIC APPARATUS

BACKGROUND OF THE INVENTION

1. Field of Invention

The present invention relates to an electro-optical device suitable for a display device, an electronic apparatus, and a method for driving the electronic apparatus.

2. Description of Related Art

Display devices, such as liquid crystal display devices and organic electroluminescence display devices, have been installed in portable apparatuses, such as cellular phones.

Recently, services for distributing images and animation content using cellular phones as terminals have been introduced. Thus, display devices for cellular phones have been required to have a multiple gray-level display function, high definition, and excellent visibility, as well as low power consumption and long operating time.

SUMMARY OF THE INVENTION

Accordingly, the present invention provides an electro-optical device which is suitable for display devices and which addresses or fulfills the above-described requirements.

A first electro-optical device according to the present invention includes pixels, each pixel including an electroluminescence element and a liquid crystal element. The electroluminescence element responds quickly to an electrical signal, and thus is suitable for displaying animation, for example. On the other hand, the liquid crystal element can control the alignment of liquid crystal with low power, and thus low power consumption can be easily achieved, for example. Accordingly, by providing the electroluminescence element and the liquid crystal element in the pixel, an electro-optical device that is suitable for display devices, which consumes low power and which has an excellent animation display function, can be achieved. If necessary, the electroluminescence element in the electro-optical device can also be used as a backlight for the liquid crystal element.

A second electro-optical device according to the present invention includes the above-described electro-optical device and further includes switching elements. This electro-optical device has a configuration suitable to control the electroluminescence element or the liquid crystal element. Herein, the switching elements are preferably provided in one pixel together with the electroluminescence element and the liquid crystal element. However, the switching elements may be provided in any part of the electro-optical device. Low-temperature polycrystalline silicon TFTs, high-temperature polycrystalline silicon TFTs, amorphous silicon TFTs, thin film diodes, or silicon-based TFTs can be used as the switching elements, for example.

A third electro-optical device according to the present invention includes a layer including an electroluminescence element, and a layer including a liquid crystal element, which are placed above a layer including switching elements. Low-temperature polycrystalline silicon TFTs, high-temperature polycrystalline silicon TFTs, amorphous silicon TFTs, thin film diodes, or silicon-based TFTs can be used as the switching elements, for example.

A fourth electro-optical device of the present invention includes the third electro-optical device of the present invention, such that the layer including the liquid crystal element is placed above the layer including the electroluminescence element. The third and fourth electro-optical devices include the electroluminescence element and the liquid crystal element, and have a configuration suitable for a thin electro-optical device.

A fifth electro-optical device of the present invention includes the above-described electro-optical device, such that the switching elements have a function to control at least one of the electroluminescence element and the liquid crystal element. In the electro-optical device, the luminance of the electroluminescence element or the luminance of the liquid crystal element can be adjusted by the switching elements.

A sixth electro-optical device of the present invention includes the above-described electro-optical device, such that the liquid crystal element functions as a reflective liquid crystal element. Therefore, the electro-optical device can be operated with low power consumption because it does not need a light source, such as a backlight.

A seventh electro-optical device of the present invention includes the above-described electro-optical device, such that at least the luminance of the electroluminescence element is controlled in a dark place, while at least the luminance of the liquid crystal element is controlled in a bright place. Therefore, the electro-optical device has excellent visibility in a bright place and consumes low power.

An eighth electro-optical device of the present invention includes the above-described electro-optical device, such that one electrode of the electroluminescence element and one electrode of the liquid crystal display element are common.

A ninth electro-optical device of the present invention includes the above-described electro-optical device, such that the other electrode of the electroluminescence element and a reflector of the liquid crystal display element are common.

In the eighth and ninth electro-optical devices, at least one electrode for the electroluminescence element also functions as an electrode for the liquid crystal display element or a reflector. Accordingly, the eighth and ninth electro-optical devices of the present invention have a configuration suitable for a thin electro-optical device. Also, the device has a small number of layers through which light is transmitted, and thus a sufficient light usage efficiency can be acquired. Furthermore, the processes for production of the electro-optical device can be simplified.

A tenth electro-optical device of the present invention includes the above-described electro-optical device, such that the switching elements are controlled to be in either an ON state or an OFF state. In the electro-optical device, a D/A converter is not needed, and only a digital drive circuit is needed. Also, the electro-optical device can include a drive circuit that is constituted by TFTs. Accordingly, the electro-optical device has a configuration that is suitable to reduce the area occupied by a peripheral circuit to operate the switching elements.

An eleventh electro-optical device of the present invention includes the above-described electro-optical device, such that each pixel includes sub-pixels, and the sub-pixels include the electroluminescence element, the liquid crystal element, and the switching elements. In the electro-optical device, the luminance of the electroluminescence element or the luminance of the liquid crystal element included in the sub-pixels can be controlled, and thus the electro-optical device has a configuration in which multiple gray-level display can be performed.

A twelfth electro-optical device of the present invention includes the eleventh electro-optical device of the present invention, such that the switching elements are controlled to be in either an ON state or an OFF state.

In the electro-optical device, a D/A converter is not needed. Also, the electro-optical device can include a drive circuit that is constituted by TFTs. Accordingly, the electro-optical device has a configuration that is suitable to reduce the area occupied by a peripheral circuit to operate the switching elements. Further, the electro-optical device has a configuration that is suitable to perform multiple gray-level display by controlling the luminance of the electroluminescence element or the luminance of the liquid crystal element.

A thirteenth electro-optical device of the present invention includes the twelfth electro-optical device of the present invention, such that a gray level is set as a function of the average luminance of the pixel. That is, the electro-optical device performs gray-scale display by binary-control of the luminance of the electroluminescence element or the liquid crystal element included in the sub-pixels, and by averaging them in each pixel. Consequently, excellent image uniformity can be realized even if the individual elements have variation.

A fourteenth electro-optical device of the present invention includes the first or second electro-optical devices of the present invention, such that each pixel includes a static RAM.

A fifteenth electro-optical device of the present invention includes any of the eleventh to thirteenth electro-optical devices of the present invention, such that each sub-pixel includes a static RAM.

The fourteenth and fifteenth electro-optical devices of the present invention only perform scanning when the data is changed because it has static RAMs, and thus a reduction in scanning frequency and scanning thinning can be achieved. Accordingly, the electro-optical device has a configuration that is suitable for low power consumption and long operating time.

A sixteenth electro-optical device of the present invention includes the fourteenth or fifteenth electro-optical devices of the present invention, such that scanning is performed when displayed data is changed. The electro-optical device has a function that is suitable for low power consumption.

A seventeenth electro-optical device of the present invention includes the above-described electro-optical device, such that the switching elements include TFTs.

An eighteenth electro-optical device of the present invention includes the seventeenth electro-optical device of the present invention, such that the TFTs are polycrystalline silicon TFTs that are produced by a low-temperature process of 600° C. or less. Using a low-temperature process, polycrystalline silicon TFTs can be provided, for example, on a substrate containing glass which has a poor thermal resistance. Accordingly, the production cost of the electro-optical device can be reduced. Further, when the temperature in the process is reduced further, the electro-optical device can be placed on a flexible substrate, such as a plastic substrate. Consequently, the electro-optical device has excellent flexibility.

A nineteenth electro-optical device of the present invention includes the above-described electro-optical device, such that a luminescent layer of the electroluminescence element includes an organic material. Full-color display can be performed by adequately selecting the organic material that constitutes the luminescent layer.

A twentieth electro-optical device of the present invention includes the above-described electro-optical device, such that the luminescent layer of the electroluminescence element includes an organic polymer material. The electroluminescence element including the luminescent layer that is made of an organic polymer material can be driven with low power, and thus the electro-optical device has a configuration that is suitable for low power consumption. In order to form the luminescent layer of the nineteenth and twentieth electro-optical devices of the present invention, a liquid-phase process, such as spin coating, roll coating, or an inkjet process, as well as a vapor-phase process, such as evaporation, can be used.

A twenty-first electro-optical device of the present invention includes the above-described electro-optical device, such that the liquid crystal of the liquid crystal element is a super twisted nematic liquid crystal having a twist angle of 180 degrees or more. In the electro-optical device, the liquid crystal element can be driven with low voltage, and thus power consumption of the electro-optical device can be reduced.

An electronic apparatus according to the present invention includes the above-described electro-optical device as a display unit.

A method for driving an electro-optical device of the present invention that includes a plurality of types of electro-optical elements, includes setting a usage condition of the plurality of types of electro-optical elements on the basis of a result obtained by measuring a predetermined physical quantity. Herein, setting the usage condition of the electro-optical elements based on the result obtained by measuring a predetermined physical quantity means, for example, selecting a preferable combination of electro-optical elements and a number of the electro-optical elements to be used from a plurality of types of electro-optical elements, and adjusting the potential of a power supply, which is a reference of power to be supplied to the electro-optical elements, on the basis of the result obtained by measuring the temperature where the electro-optical device is used, the intensity of external light, the luminance of the electro-optical elements, the resistance of the electro-optical elements, and so on.

When the electro-optical device is used for a display device of a portable electronic apparatus, for example, low power consumption as well as visibility may be required. In that case, low power consumption and visibility can be achieved by selecting a suitable combination of the electro-optical elements based on the measured intensity of external light and power consumption according to the type of the electro-optical element.

In the above-described method for driving the electro-optical device, the plurality of types of electro-optical elements include a luminescent element and a liquid crystal element.

The above-described method for driving the electro-optical device is useful for a method in which a plurality of types of electro-optical elements, such as a luminescent element and a liquid crystal element, are provided in each pixel.

A method for driving an electronic apparatus according to the present invention that includes a plurality of types of electro-optical elements, includes a first step of measuring a predetermined physical quantity, and a second step of setting the usage condition of the plurality of types of electro-optical elements on the basis of the measurement result obtained in the first step. Examples of the predetermined physical quantity include the temperature, the intensity of external light, the luminance of the electro-optical elements, and the resistance of the electro-optical elements.

Herein, setting the usage condition means setting the usage condition of the liquid crystal element and the luminescent element in accordance with, for example, the operating environment of the electronic apparatus, deterioration of the electro-optical elements due to increase in the operating time of the liquid crystal element or the luminescent element. More specifically, an adequate combination of the electro-optical elements and the types of the electro-optical elements to be used are selected from the liquid crystal element and the luminescent element. Further, when the electro-optical device is used as a display device, a part of the display device can be displayed using the other electro-optical element.

In the above-described electronic apparatus, the intensity of external light and the luminance of the electro-optical elements can be measured by providing a device to measure intensity of light. Further, by providing a device to supply a signal to the electro-optical device to set the usage condition of the electro-optical elements, such as the liquid crystal elements and the organic electroluminescence element, the usage condition of the electro-optical elements can be set based on the result obtained by measuring the intensity of light.

When the "intensity of light" is the intensity of external light in the environment where the electro-optical device is placed, the usage condition of the electro-optical elements can be set based on the operation environment of the electro-optical device, for example, whether the environment is dark or bright.

When the "intensity of light" corresponds to the luminance of the electro-optical elements, the deterioration of the electro-optical elements is measured. Accordingly, the usage condition of the electro-optical elements can be set based on the deterioration of the electro-optical elements. Consequently, the power to be supplied to the electro-optical elements can be adjusted so that a predetermined luminance can be obtained.

The above-described electronic apparatus further includes a device to provide a signal to the electro-optical device to set each usage condition of the liquid crystal element and the organic electroluminescence element on the basis of the light intensity measured by the device to measure light intensity.

DETAILED DESCRIPTION OF PREFERRED EMBODIMENTS

Hereinafter, preferred embodiments of the present invention will be described.

Figure 1:
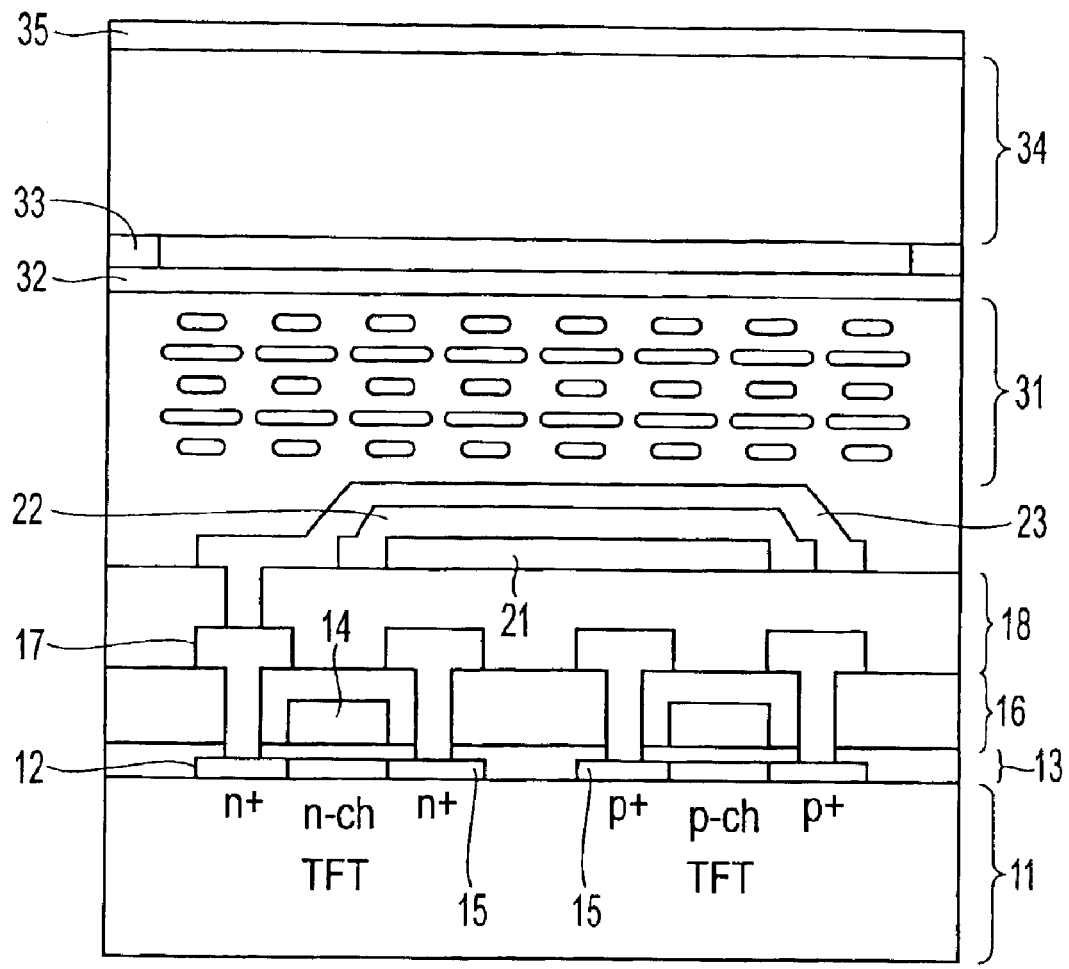
FIG. 1 is a sectional view of an electro-optical device according to an embodiment of the present invention.

FIG. 1 is a sectional view of an electro-optical device according to an embodiment of the present invention. The device includes thin film transistors (TFTs) as switching elements, an organic electroluminescence element as an electroluminescence element, and a reflective liquid crystal element as a liquid crystal element. The TFTs include a semiconductor layer 12 which is made of polycrystalline silicon and which includes a source region and a drain region 15, a gate insulating film 13, gate electrodes 14, a first interlayer insulating film 16, and source electrodes and drain electrodes 17. The organic electroluminescence element includes an underlayer electrode 21, a luminescent layer 22, and a pixel electrode 23. The reflective liquid crystal element includes the underlayer electrode 21, the pixel electrode 23, liquid crystal 31, a counter electrode 32, a color filter 33, and a polarizer 35. The pixel electrode 23 is shared by the organic electroluminescence element and the liquid crystal element. When the underlayer electrode 21 is made of material having a high light-reflection efficiency, such as metal, the underlayer electrode 21 functions as a reflector of the liquid crystal element. In the electro-optical device having the above-described configuration, the organic electroluminescence display element emits unpolarized light. Accordingly, the emitted light is not modulated by the liquid crystal element, and the light from the organic electroluminescence element is visible from the polarizer 35 side. Further, by making the color of the light emitted from the organic electroluminescence element match the color of the light transmitted through the color filter 33, the color filter does not degrade the light usage efficiency.

With this configuration of the electro-optical device, the advantages of the organic electroluminescence element and the reflective liquid crystal element can both be provided according to need. For example, the electro-optical device is constituted so that at least the organic electroluminescence element and the reflective liquid crystal element can be used in dark and bright environments respectively, thereby providing both advantages, that is, excellent visibility and low power consumption, which are usually mutually exclusive. For example, in a bright place, the reflective liquid crystal element is operated instead of the organic electroluminescence element, which usually causes a visibility problem, so as to enhance the visibility of the electro-optical device as a display device. At this time, by applying a voltage in the opposite direction to the underlayer electrode 21, current is not supplied to the organic electroluminescence element, and thus power consumption can be reduced.

Also, in the electro-optical device, the organic electroluminescence element and the reflective liquid crystal element can be driven by the same TFT. This operation is cost-efficient compared to the case where a TFT is provided for each of the elements. Furthermore, since the TFTs are provided under the organic electroluminescence element and the reflective liquid crystal element, the light-emitting area of the organic electroluminescence element or the aperture ratio of the reflective liquid crystal element is not reduced. In addition, since the TFTs are provided under the organic electroluminescence element and the liquid crystal element, a complex circuit, such as a static random access memory (RAM) can be provided.

The liquid crystal 31 can be provided on the pixel electrode 23 with an alignment layer therebetween so that the alignment of the liquid crystal is enhanced. Various methods can be used for liquid crystal alignment, such as rubbing, off-axis deposition, and UV irradiation, for example.

Figure 2:
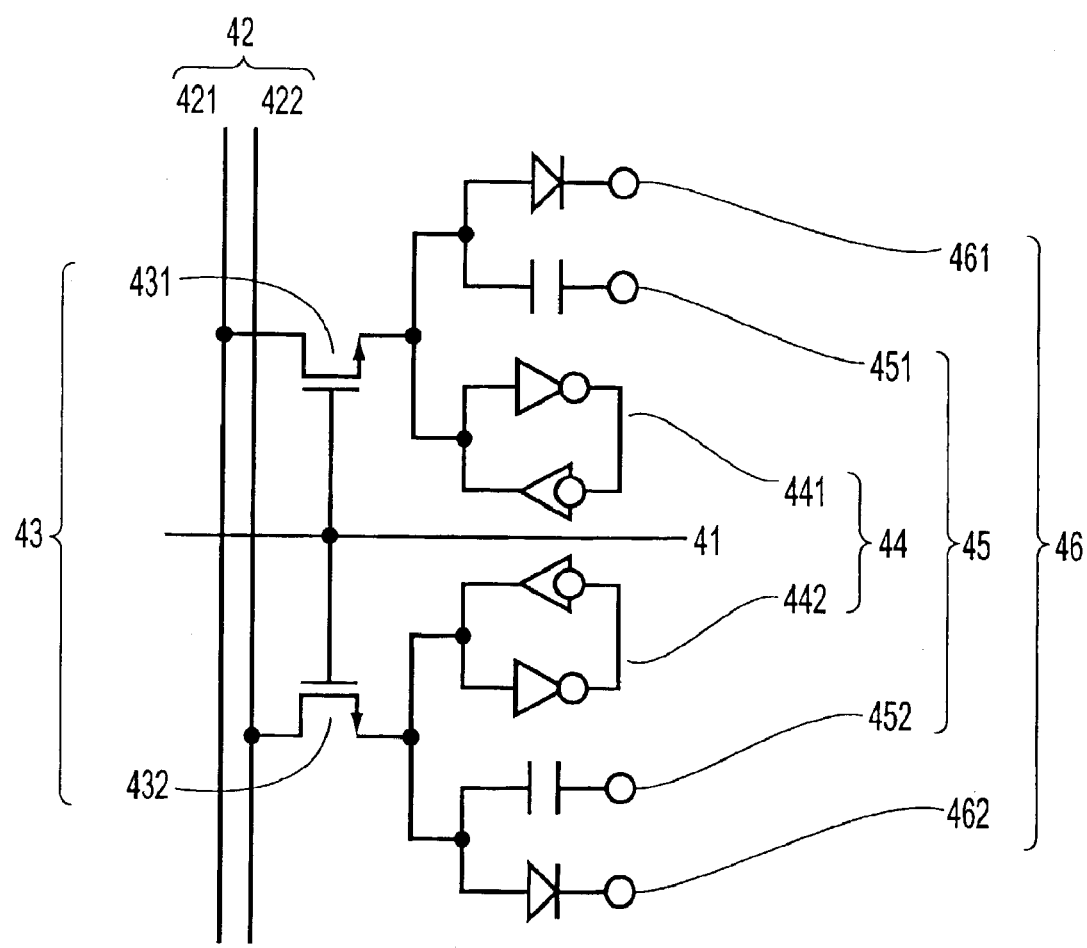
FIG. 2 is a schematic that shows a pixel equivalent circuit of the electro-optical device according to the embodiment of the present invention.

FIG. 2 is a schematic of a pixel equivalent circuit according to the electro-optical device having the configuration shown in FIG. 1. In FIG. 2, a plurality of scan lines 41 and a plurality of signal lines 42 are arranged in a matrix and the TFTs 43, static random access memories (RAMs) 44, reflective liquid crystal elements 45, and organic electroluminescence elements 46 are provided at the intersections of the scan lines 41 and the signal lines 42.

In this embodiment, the gray-scale is represented by 2 bits, and thus a low-bit signal line 421 and a high-bit signal line 422 are provided as the signal lines 42. Accordingly, a low-bit TFT 431 and a high-bit TFT 432 are provided as the TFTs 43, and a low-bit static RAM 441 and a high-bit static RAM 442 are provided as the static RAMs 44. Further, a low-bit reflective liquid crystal element 451 and a high-bit reflective liquid crystal element 452 are provided as the reflective liquid crystal elements 45. A low-bit organic electroluminescence element 461 and a high-bit organic electroluminescence element 462 are provided as the organic electroluminescence elements 46.

While a selection pulse is applied to the scan lines 41, a picture signal is applied to the signal lines 42, and is held by the static RAMs 44 through the TFTs 43. Light reflection is controlled by applying voltages to the reflective liquid crystal elements 45. Also, light emission is controlled by supplying currents to the organic electroluminescence elements 46. Since the electro-optical device of this embodiment includes the static RAMs 44 which are capable of holding a picture signal, scanning at a constant period is not needed; rather, scanning is only performed when the image display is changed. Consequently, the electro-optical device has a configuration that is suitable to reduce power consumption.

Also, the electro-optical device has a configuration that is suitable for gray-scale display using a digital (binary) driving method, in which any of the ON state and OFF state of the TFTs is selected. For example, by setting the luminance of the reflective liquid crystal element to 0 and 1, and setting the luminance of the organic electroluminescence element also to 0 and 1, the total area occupied by the organic electroluminescence element and the reflective liquid crystal element of the luminance of 1 or 0 corresponds to the gray-scale. This gray-scale method is generally referred to as "an area ratio gray-scale method" (M. Kimura, et al, Proc. Euro Display '99, Late-News Papers (1999), 71; M. Kimura, et al, Proc. IDW '99 (1999), 171; M. Kimura, et al, Dig. AM-LCD 2000 (2000), 245; M. Kimura, et al, to be published in J. SID 8 (2000), 1; Japanese Unexamined Patent Application Publication Nos. 09-090345, 10-068931, 09-233107; and Japanese Patent Application No. 11-305740).

In the electro-optical device, the area ratio of the low-bit reflective liquid crystal element 451 and the high-bit reflective liquid crystal element 452 is 1:2. Since the amount of light reflection is proportional to the light reflection area, the ratio of the amount of light reflection is also 1:2, and thus 4 gray levels can be obtained. The area ratio of the low-bit organic electroluminescence element 461 and the high-bit organic electroluminescence element 462 is 1:2. Since the amount of light emission is proportional to the light emission area, the ratio of the amount of light emission is also 1:2, and thus 4 gray levels can be obtained. The spirit of the present invention can be applied to a 3-bit gray-scale or higher.

In this embodiment, CMOS-inverter-type static RAMs 44 are used, but any type of static RAMs 44, such as depletion-load-type and high-resistance polycrystalline-silicon-load-type, can be applied to the present invention.

Various liquid crystal compounds, such as super twisted nematic liquid crystal having a twist angle of 180 degrees or more, can be used for the liquid crystal material for the reflective liquid crystal elements. The reflective liquid crystal element containing the super twisted nematic liquid crystal having a twist angle of 180 degrees or more is advantageous in that it can be driven with a low voltage. Also, in this embodiment, the super twisted nematic liquid crystal is used as the liquid crystal material for the reflective liquid crystal display element and is steadily driven by the static RAM, and thus the response speed is not very slow.

Various electroluminescence materials, for example, an organic polymer, such as paraphenylene vinylene and its derivatives, can be used for the luminescent layer of the organic electroluminescence element. The organic electroluminescence element including the luminescent layer that is made of organic polymer can be driven with low power, and thus the power consumption of the electro-optical device can be reduced.

The TFTs are used as the switching elements in this embodiment, but, for example, thin film diodes (TFDs) can also be used according to requirements.

Figure 3A:
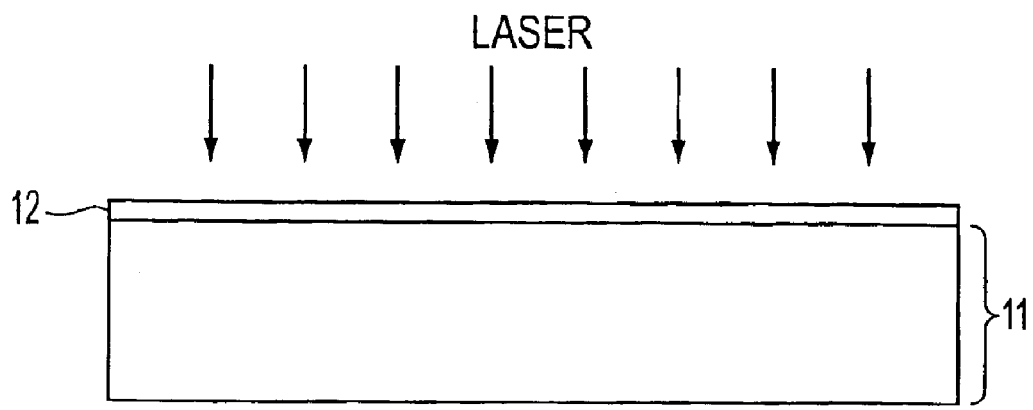
FIGS. 3(a)–3(c) are schematics that show a process for producing TFTs according to the embodiment of the present invention.
Figure 3B:
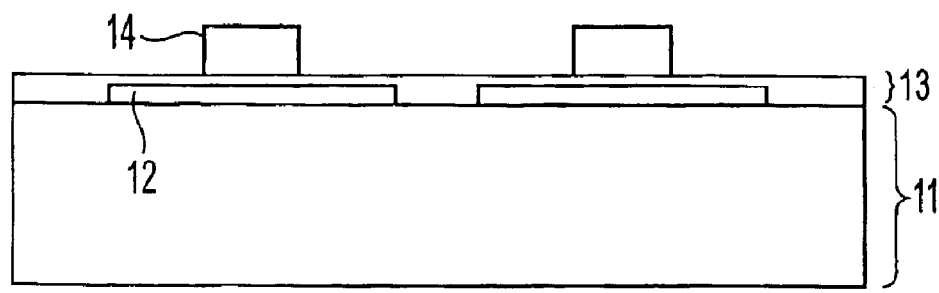
Figure 3C:
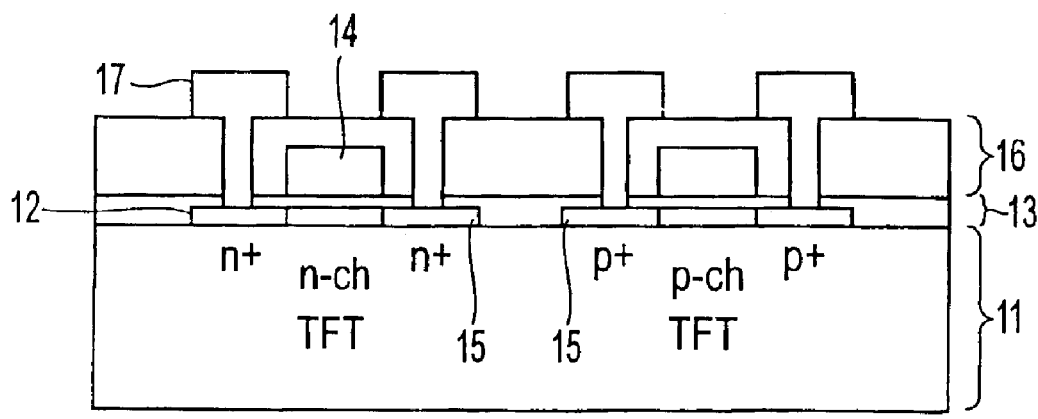

FIGS. 3(a)–3(c) are schematics that show a process for producing the TFTs used as the switching elements of the embodiment according to the present invention, using a low-temperature process. Specifically, an amorphous silicon film is formed on an array substrate 11 by PECVD using $SiH_4$ and by LPCVD using $Si_2H_6$. Then, the amorphous silicon is recrystallized by laser irradiation, for example, excimer laser irradiation, or solid-phase growth, so as to form polycrystalline silicon 12 (FIG. 3(a)). After patterning of the polycrystalline silicon 12, the gate insulating film 13 is formed. The gate electrodes 14 are formed by deposition and patterning (FIG. 3(b)). An impurity, such as phosphorus or boron, is implanted into the polycrystalline silicon 12 by self-alignment using the gate electrodes, so as to form the source region and drain region 15 having a CMOS structure. Then, the first interlayer insulating film 16 is formed, contact holes are formed, and the source electrodes and drain electrodes 17 are formed by deposition and patterning (FIG. 3(c)).

Although not shown in FIGS. 3(a)–(c), the TFTs used as the static RAMs, as well as the TFTs for the switching elements, are formed on a glass substrate by the so-called low-temperature process of 600° C. or less.

Figure 4A:
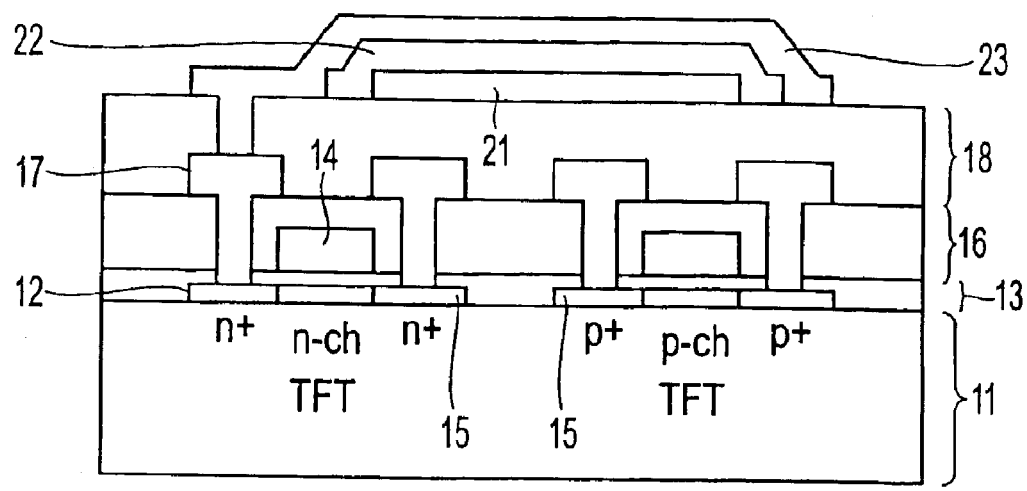
FIGS. 4(a)–4(b) are schematics that show a process for producing an organic electroluminescence element and a reflective liquid crystal element according to the embodiment of the present invention.
Figure 4B:
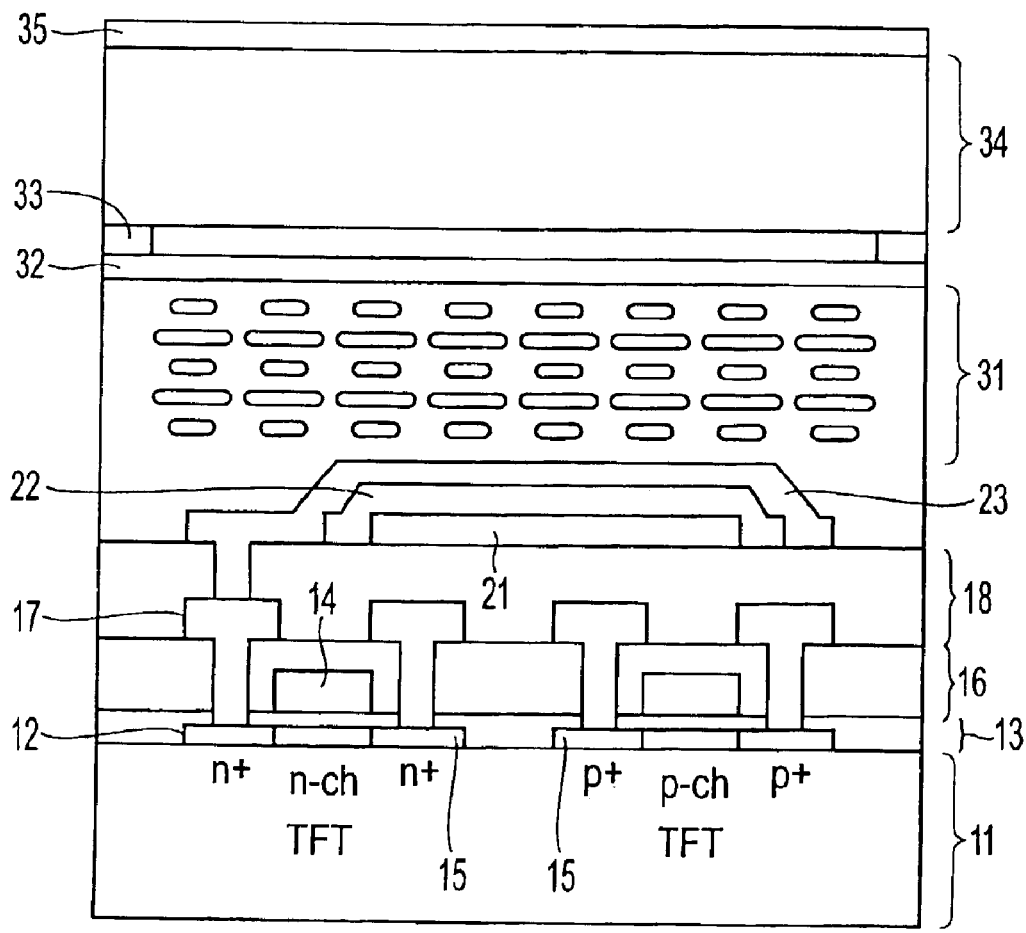

FIGS. 4(a) and 4(b) are schematics that show a process for producing the organic electroluminescence element and the reflective liquid crystal element according to the embodiment of the present invention. A second interlayer insulating film 18 is formed, and the underlayer electrode 21 is formed by deposition and then patterning. The luminescent layer 22 is formed by a liquid-phase process, such as spin coating (T. Shimada, M. Kimura, et al, Proc. Asia Display '98, 217 (1998)), squeegee coating, or an inkjet process (T. Shimada, S. Seki, et al, Dig. SID '99 (1999), 376; and S. Kanbe, et al, Proc. Euro Display '99 Late-News Papers (1999), 85), or a vacuum process, such as sputtering or evaporation. A contact hole is formed, and the pixel electrode 23 is formed by deposition and then patterning (FIG. 4(a)). Then, the reflective liquid crystal element is formed by an ordinary process ("Color liquid crystal display playing a leading roll in mobile technologies", Session 4 of talks at Electronic Display Forum 98).

Peripheral circuits, such as a shift register, a scan line driver, a signal line driver, and a CPU can be provided after the above-described processes. However, the peripheral circuits, such as the shift register, the scan line driver, the signal line driver, or the CPU, can be integrated on the glass substrate when the switching elements and the static RAMs are formed.

Figure 5:
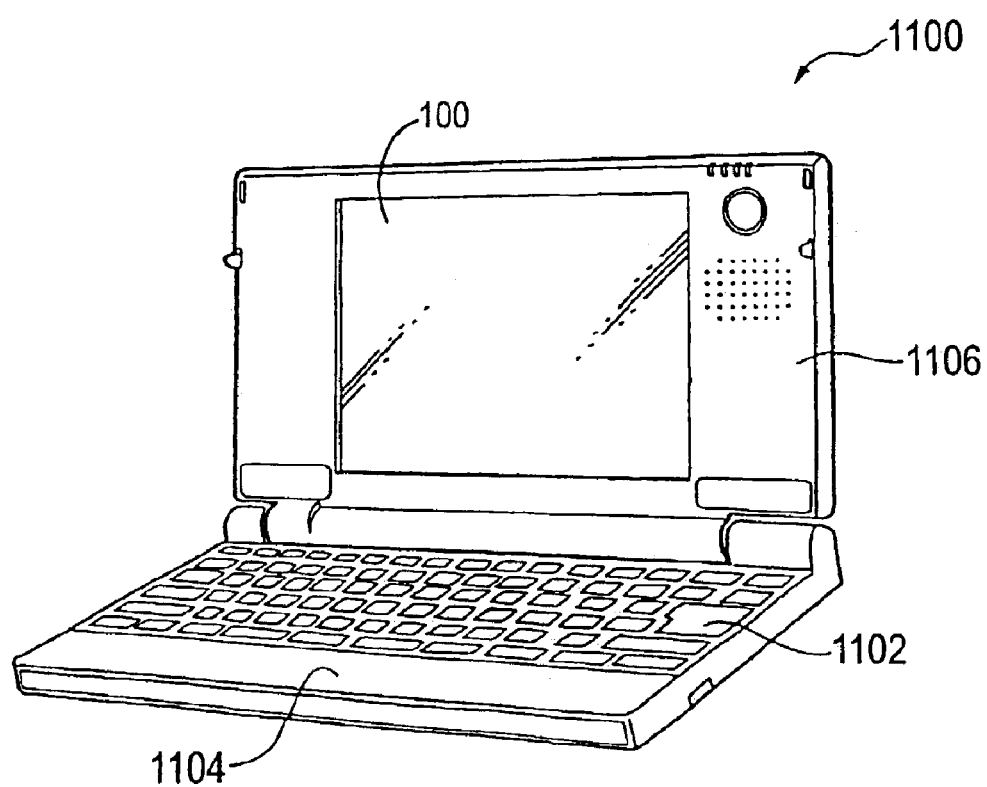
FIG. 5 is a perspective view that shows an example of a mobile personal computer on which the electro-optical device according to the present invention is mounted.

Next, examples of electronic apparatuses using the above-described electro-optical device are described. FIG. 5 is a perspective view showing the configuration of a mobile personal computer using the electro-optical device. In FIG. 5, the personal computer 1100 includes a main body 1104 having a keyboard 1102 and a display unit 1106. The display unit 1106 includes the foregoing electro-optical device 100.

Figure 6:
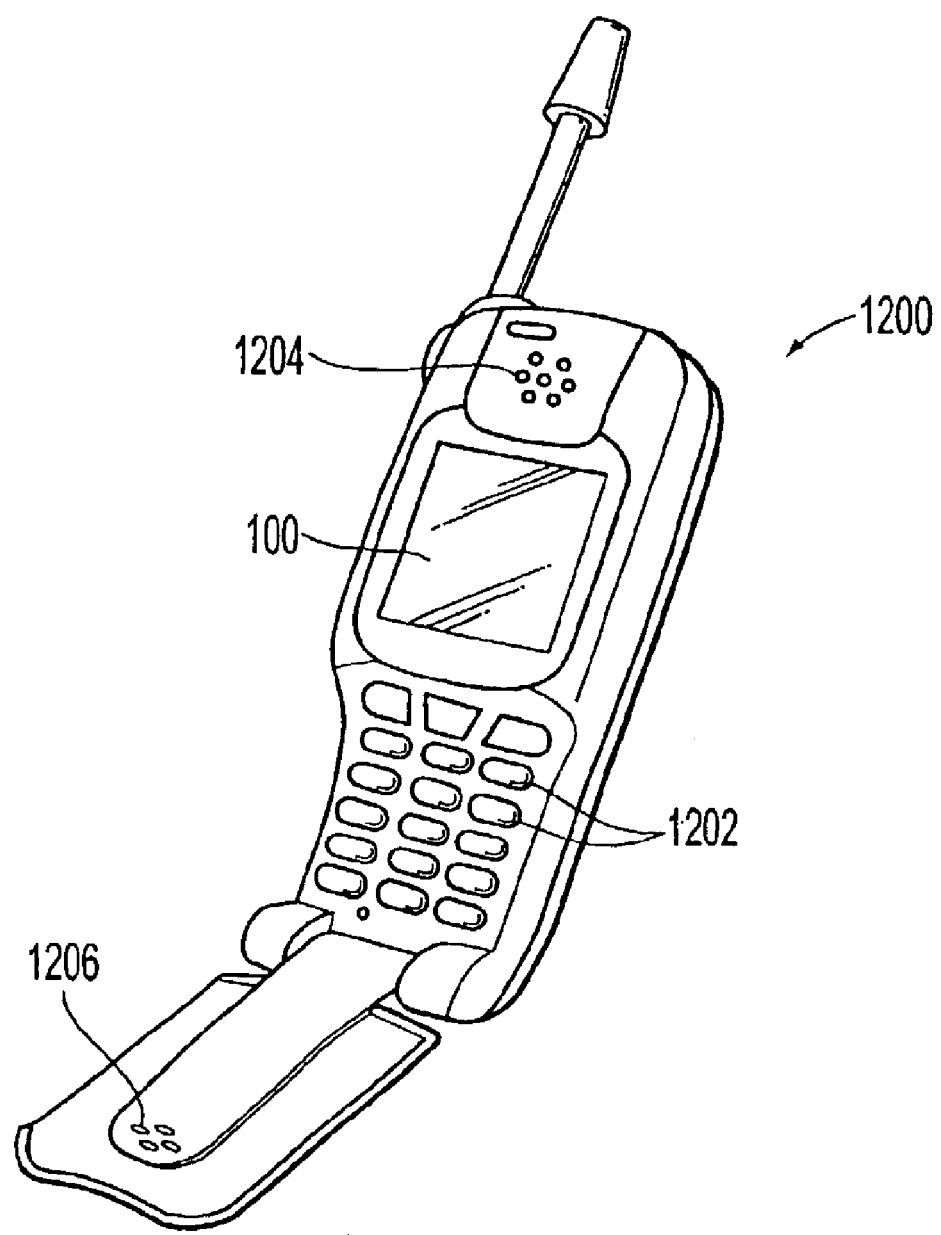
FIG. 6 is a perspective view that shows an example of a cellular phone on which the electro-optical device according to the present invention is mounted.

FIG. 6 is a perspective view showing the configuration of a cellular phone using the electro-optical device 100 as a display unit. In FIG. 6, the cellular phone 1200 includes a plurality of operation buttons 1202, an earpiece 1204, a mouthpiece 1206, and the electro-optical device 100.

Figure 7:
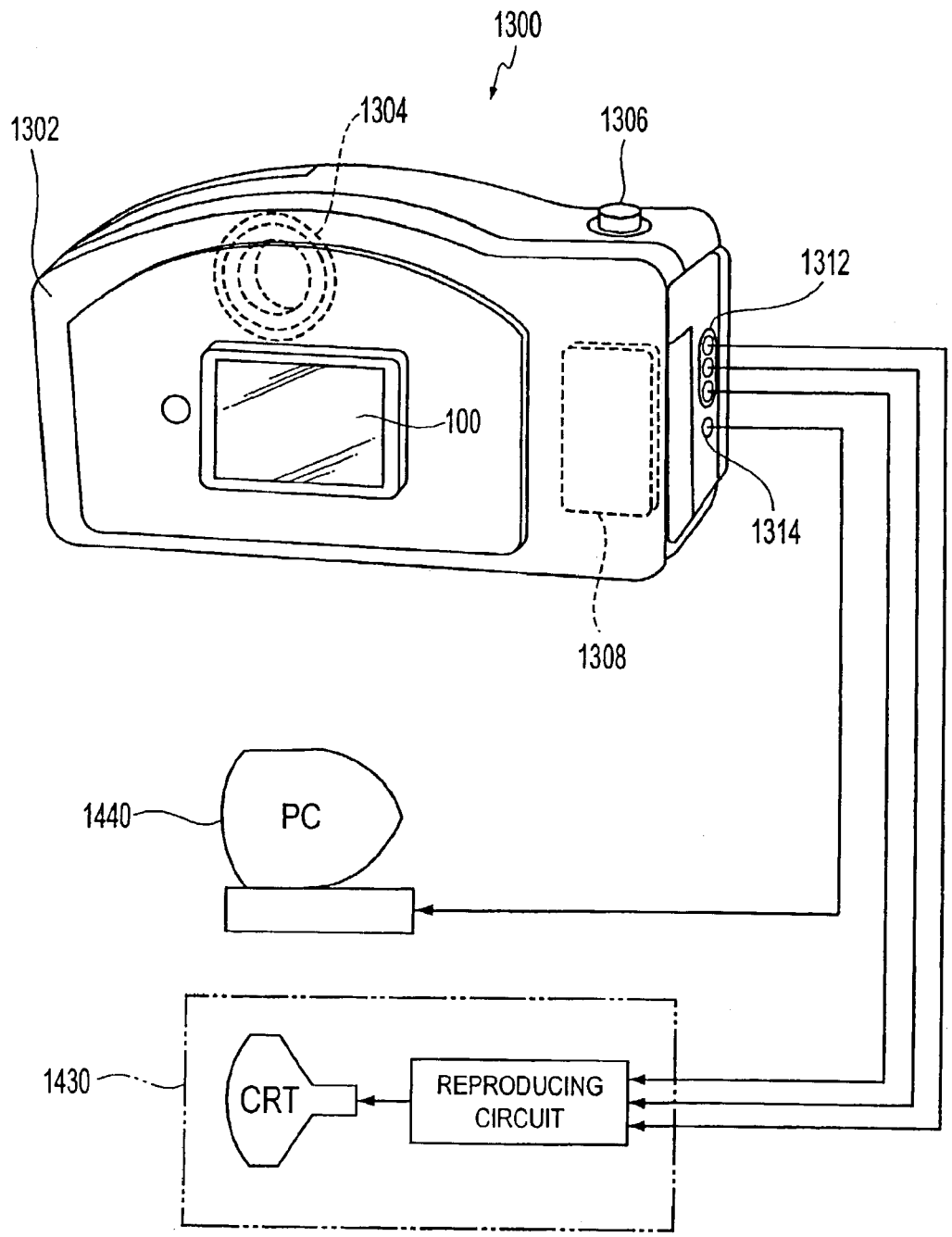
FIG. 7 is a perspective view and schematic that shows an example of a digital still camera in which the electro-optical device according to the present invention is used as the finder.

FIG. 7 is a perspective view and schematic showing the configuration of a digital still camera using the electro-optical device 100 as a finder. FIG. 7 plainly shows the connection between the digital still camera and external equipment. In an ordinary camera, film is exposed to the optical image of an object. On the other hand, the digital still camera 1300 performs photoelectric conversion of the optical image of an object by an imaging device, such as a charge coupled device (CCD), so as to generate an image signal. On the back surface of a casing 1302 of the digital still camera 1300, the foregoing electro-optical device 100 is provided, and display is performed on the basis of the image signal generated by the CCD. Herein, the electro-optical device 100 functions as a finder to display objects. Also, on the front surface (back side in FIG. 7) of the casing 1302, a light-receiving unit 1304 that includes an optical lens and the CCD is provided.

When a photographer views the image of an object that is displayed on the electro-optical device 100 and pushes a shutter button 1306, an image signal that is generated by the CCD at that time is transmitted to, and stored in, a memory on a circuit board 1308. Also, in the digital still camera 1300, video signal output terminals 1312, and an input/output terminal for data communication 1314 are provided in a side surface of the casing 1302. Further, as shown in FIG. 7, a television monitor 1430 can be connected to the video signal output terminals 1312 and a personal computer 1440 can be connected to the input/output terminal for data communication 1314, according to requirements. In addition, the image signal that is stored in the memory on the circuit board 1308 is output to the television monitor 1430 and the personal computer 1440 by a predetermined operation.

In addition to the personal computer in FIG. 5, the cellular phone in FIG. 6, and the digital still camera in FIG. 7, other electronic apparatuses to which the electro-optical device 100 of the present invention is applied include a television set, a video tape recorder of viewfinder type or monitor direct-view type, a car navigation system, a pager, an electronic notebook, an electronic calculator, a word processor, a workstation, a videophone, a POS terminal, and equipment having a touch panel, for example. Needless to say, the electro-optical device 100 can be used as the display unit of each of these and other electronic apparatuses. Examples of electro-optical elements used for the electro-optical device 100 include an organic electroluminescence element, an inorganic electroluminescence element, a reflective liquid crystal element, a transmissive liquid crystal element, an electrophoretic element, and an electron emission element, for example.

Figure 8:
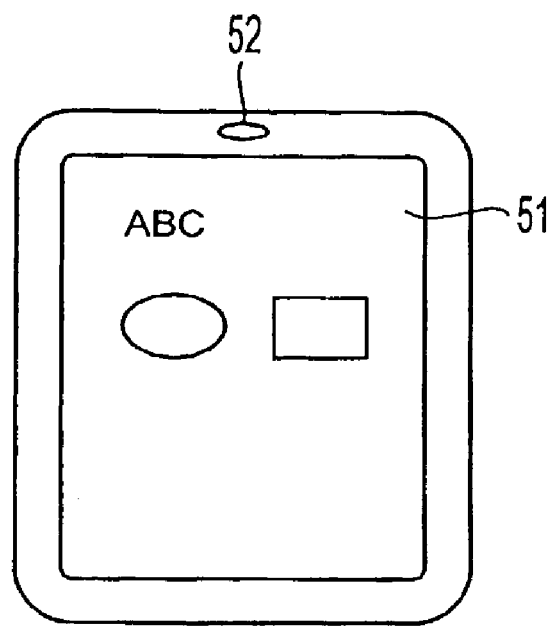
FIG. 8 is a schematic that shows an electronic apparatus according to an embodiment of the present invention.

FIG. 8 is a schematic that shows an electronic apparatus according to an embodiment of the present invention. The electronic apparatus includes the electro-optical device, a display unit 51, and a light intensity measuring device 52. An electro-optical element used for the display unit 51 can be selected in accordance with the application and required performance from, for example, an organic electroluminescence element, an inorganic electroluminescence element, a reflective liquid crystal element, a transmissive liquid crystal element, an electrophoretic element, and an electron emission element. It is preferable to use a plurality of electro-optical elements, such as the organic electroluminescence element and the reflective liquid crystal element, in order to achieve enhanced power consumption and visibility.

Any light intensity measuring device having any material, structure, or method can be used for the light intensity measuring device 52, as long as the light intensity can be measured. Typical examples include a CMOS image sensor, a CCD, and a photodiode, for example.

Figure 9:
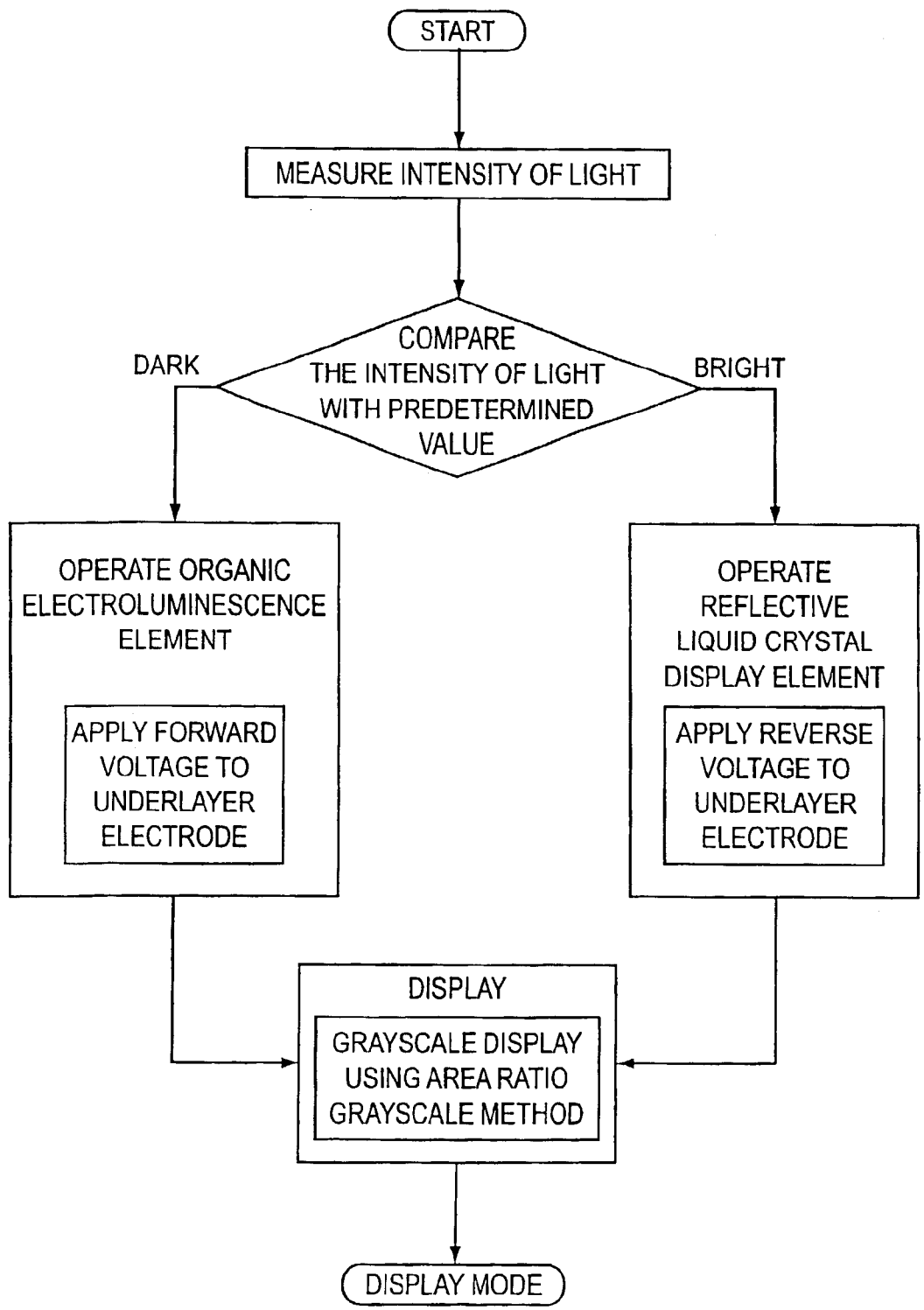
FIG. 9 is a flow chart that shows the operation of the electronic apparatus according to the embodiment of the present invention.

Subsequently, a method for setting a usage mode of the electro-optical elements in the electronic apparatus shown in FIG. 8 is described with reference to FIG. 9. Basically, the usage mode of the electro-optical elements is set based on whether the intensity of external light measured by the light intensity measuring device 52 is larger or smaller than a predetermined value which is appropriately set.

Hereinafter, a specific description is provided using an example in which the electro-optical device shown in FIG. 1 is used for the display unit 51 of the electronic apparatus shown in FIG. 8. After the intensity of external light is measured, the organic electroluminescence element is operated if the result is dark, and the reflective liquid crystal element is operated if the result is bright. More specifically, when the organic electroluminescence element is operated, a voltage is applied to the underlayer electrode 21 shown in FIG. 1 so that the organic electroluminescence element has a forward voltage. For example, when the organic electroluminescence element has a diode characteristic in which a current flows from the pixel electrode 23 to the underlayer electrode 21, a voltage that is lower than that of the pixel electrode 23 is applied to the underlayer electrode 21. Otherwise, a voltage higher than that of the pixel electrode 23 is applied to the underlayer electrode 21. At this time, the reflective liquid crystal element also responds, but the emitted light from the organic electroluminescence element is not modulated because the light is unpolarized.

When the reflective liquid crystal element is operated, a voltage is applied to the underlayer 21 so that the organic electroluminescence element has a reverse voltage. For example, when the organic electroluminescence element has a diode characteristic in which a current flows from the pixel electrode 23 to the underlayer electrode 21, a voltage that is higher than that of the pixel electrode 23 is applied to the underlayer electrode 21. Otherwise, a voltage that is lower than that of the pixel electrode 23 is applied to the underlayer electrode 21. The reverse voltage does not cause current flow and light emission, and thus the power consumption does not wastefully increase.

In the electronic apparatus shown in FIG. 8, the usage mode of the electro-optical elements is set based on the intensity of external light. However, the usage mode of the electro-optical elements can be set based on, for example, deterioration of the electro-optical elements, or on the result obtained by measuring the remaining battery. Also, the usage mode can be set by a user himself using a switch or the like.

Furthermore, an adequate method for driving the electro-optical elements can be selected from an active driving method and a passive driving method in accordance with the required power consumption, the display panel size, the display quality, the production cost, and so on.

Various gray-scale methods can be adopted for the gray-scale method for the electro-optical elements. For example, a method in which the gray-scale is obtained by analog-control of the current or the voltage applied to the electro-optical elements, and a time ratio gray-scale method in which the gray-scale is obtained by controlling the period of the ON state of the electro-optical elements can be adopted along with the above-described area ratio gray-scale method. When the area ratio gray-scale method is adopted, the power consumption can be reduced by using the static RAMs.

What is claimed is:

1. An electro-optical device, comprising:
   a plurality of signal lines; and
   a plurality of pixels, each pixel including:
      an electroluminescence element;
      a liquid crystal element; and
      a switching element,
      wherein light emission of the electroluminescence element and light reflection through the liquid crystal element are controlled according to a signal supplied through a signal line of the plurality of signal lines and wherein both the electroluminescence element and the liquid crystal element are controlled by the switching element.

2. The electro-optical device according to claim 1, the liquid crystal element functioning as a reflective liquid crystal element.

3. The electro-optical device according to claim 2, liquid crystal of the liquid crystal element being a super twisted nematic liquid crystal having a twist angle of 180 degrees or more.

4. The electro-optical device according to claim 1, at least a luminance of the electroluminescence element being controlled in a dark place, while at least a luminance of the liquid crystal element being controlled in a bright place.

5. The electro-optical device according to claim 1, one electrode of the electroluminescence element and one electrode of the liquid crystal display element being common.

6. The electro-optical device according to claim 5, the other electrode of the electroluminescence element and a reflector of the liquid crystal display element being common.

7. The electro-optical device according to claim 1, the switching element being controlled to be in one of an ON state and an OFF state.

8. The electro-optical device according to claim 1, each pixel including sub-pixels, and the sub-pixels including the electroluminescence element, liquid crystal element, and switching elements.

9. The electro-optical device according to claim 8, the switching elements being controlled to be in one of an ON state and an OFF state.

10. The electro-optical device according to claim 9, a gray level being set as the function of an average luminance of the pixel.

11. The electro-optical device according to claim 8, each sub-pixel including a static RAM.

12. The electro-optical device according to claim 1, each pixel including a static RAM.

13. The electro-optical device according to claim 12, scanning being performed when displayed data is changed.

14. The electro-optical device according to claim 1, the switching element including at least one TFT.

15. The electro-optical device according to claim 14, the TFTs being polycrystalline silicon TFTs produced by a low-temperature process of 600° C. or less.

16. The electro-optical device according to claim 1, a luminescent layer of the electroluminescence element including an organic material.

17. The electro-optical device according to claim 1, a luminescent layer of the electroluminescence element including an organic polymer material.

18. An electronic apparatus, comprising:
    the electro-optical device according to claim 1, the electro-optical device being usable as a display unit.

19. The electronic apparatus according to claim 18, further including a device that measures light intensity.

20. The electronic apparatus according to claim 19, further including a device that provides a signal to set each usage condition of the liquid crystal element and the electroluminescence element to the electro-optical device on the basis of light intensity measured by the device that measures light intensity.

21. An electro-optical device, comprising:
    a layer including switching elements;
    a layer including an electroluminescence element; and
    a layer including a liquid crystal element,
    wherein the layer including the electroluminescence element is placed above the layer including the switching elements and the layer including the liquid crystal element is placed above the layer including the switching elements, and further
    wherein the layer including the liquid crystal element is placed above the layer including the electroluminescence element.

22. A method for driving an electro-optical device, the electro-optical device including a plurality of pixels, each pixel comprising an electroluminescence element, a liquid crystal element and a switching element, the method comprising the step of:
    selectively driving the electroluminescence element and the liquid crystal element for displaying images based on a condition at which the electro-optical device is used, wherein both the electroluminescence element and the liquid crystal element are controlled by the switching element.

23. An electro-optical device with a plurality of pixels, each of the pixels comprising:
    a switching element;
    a first electro-optical element; and
    a second electro-optical element different from the first electro-optical element, wherein the first electro-optical element and the second electro-optical element are selectively driven to display images based on a condition at which the electro-optical device is used, wherein the first electro-optical element and the second electro-optical element are an electroluminescence element and a liquid crystal element, respectively, and further wherein both the electroluminescence element and the liquid crystal element are placed above the switching element, and the liquid crystal element is placed above the electroluminescence element.

* * * * *